United States Patent
Takahashi et al.

(10) Patent No.: US 6,605,369 B1
(45) Date of Patent: Aug. 12, 2003

(54) SURFACE-TREATED COPPER FOIL AND METHOD FOR PRODUCING THE SAME

(75) Inventors: Naotomi Takahashi, Ageo (JP); Yutaka Hirasawa, Ageo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 4 days.

(21) Appl. No.: 09/913,775

(22) PCT Filed: Nov. 27, 2000

(86) PCT No.: PCT/JP00/08331

§ 371 (c)(1),
(2), (4) Date: Aug. 14, 2001

(87) PCT Pub. No.: WO01/45475

PCT Pub. Date: Jun. 21, 2001

(30) Foreign Application Priority Data

Dec. 15, 1999 (JP) .............................................. 11-356616

(51) Int. Cl.$^7$ ............................ B32B 15/04; C25D 5/00
(52) U.S. Cl. ...................... 428/623; 428/546; 428/618; 428/641; 428/658; 428/674; 428/675; 428/447; 428/461; 428/901; 205/76; 205/111; 205/176; 205/177; 205/178; 205/182; 205/224; 205/227; 205/244; 205/283; 205/291; 205/305
(58) Field of Search ................................. 428/546, 548, 428/618, 623, 641, 658, 674, 675, 447, 461, 901; 205/111, 917, 291, 178, 76, 305, 182, 283, 177, 176, 224, 227, 244

(56) References Cited

U.S. PATENT DOCUMENTS 6,329,074 B1 * 12/2001 Fujiwara et al. ............ 428/632

FOREIGN PATENT DOCUMENTS

| JP | 05-29740 | * | 5/1993 | ............ H05K/1/09 |
| JP | 07-231161 | * | 8/1995 | ............ H05K/3/38 |

OTHER PUBLICATIONS

* References are from PCT search report provided by applicants.*

* cited by examiner

Primary Examiner—Deborah Jones
Assistant Examiner—Ling Xu
(74) Attorney, Agent, or Firm—Jenkens & Gilchrist

(57) ABSTRACT

The present invention is directed to provision of a surface-treated copper foil exhibiting a maximum effect of a silane coupling agent which is adsorbed onto the copper foil and is employed in order to enhance adhesion between the copper foil and a substrate during manufacture of printed wiring boards. The invention is also directed to provision of a method for producing such a copper foil. To attain these goals, a surface-treated copper foil for producing printed wiring boards is provided, wherein an anti-corrosion treatment comprises forming a zinc layer or a zinc alloy layer on a surface of the copper foil and forming an electrodeposited chromate layer on the zinc or zinc alloy layer; forming a silane-coupling-agent-adsorbed layer on the electrodeposited chromate layer without causing the electrodeposited chromate layer of the nodular-treated surface to dry; and drying.

13 Claims, 4 Drawing Sheets

SURFACE-TREATED COPPER FOIL AND METHOD FOR PRODUCING THE SAME

TECHNICAL FIELD

The present invention relates to a copper foil having a surface-treated layer for producing printed wiring boards and to a method for producing the copper foil.

BACKGROUND ART

Conventionally, copper foil has been employed as a material for producing printed wiring boards, which are widely used in the electric and electronics industries. In general, copper foil is bonded, through hot-pressing, onto an electrically insulating polymer material substrate such as glass-epoxy substrate, phenolic polymer substrate, or polyimide, to thereby form a copper-clad laminate, and the thus-prepared laminate is used for producing printed wiring boards.

In this connection, at least one side of a copper foil which is to be laminated with any of a variety of substrates through hot-pressing is subjected to nodular treatment. The nodular treatment is carried out so as to enhance adhesion between the copper foil and the substrate, on the basis of an anchor effect. Specifically, copper microparticles are formed on a surface of the copper foil through electrodeposition. Subsequently, a variety of surface treatments are further carried out in consideration of long-term storage stability of the copper foil and favorable adhesion to any of a variety of substrates formed of organic material.

In order to ensure favorable adhesion between a metallic copper foil and any of a variety of substrates formed of an organic material, a silane coupling agent has generally and widely been used.

In a copper-clad laminate, the silane coupling agent is present between a metallic copper foil and a substrate formed of an organic material. However, details of the silane coupling agent; e.g., the method of employment thereof, have not been sufficiently studied. Conventionally, there have been filed several patent applications with regard to a copper foil employing a silane coupling agent.

For example, Japanese Patent Publication (kokoku) Nos. 15654/1985 and 19994/1990 disclose a copper foil in which a zinc layer or zinc alloy layer is formed on a surface of the foil, a chromate layer is formed on the zinc or zinc alloy layer, and a silane coupling layer is formed on the chromate layer. Taking the entirety of the aforementioned patent publications into consideration, the feature of these patents is focused on drying treatment performed after formation of a chromate layer, and treatment with a silane coupling agent performed after drying. However, the present inventors have found that copper foil of expected performance cannot be obtained; i.e., performance and quality of copper foil varies greatly between lots, even though the copper foil is produced, on a trial basis, by means of the disclosed methods.

Japanese Patent Publication (kokoku) No. 17950/1990 discloses that treatment of copper foil with a silane coupling agent is able to improve resistance to hydrochloric acid, but does not particularly disclose the moisture resistance of copper foil. In recent years, problems have arisen which corresponds to trends toward formation of microwiring and multilayer printed wiring boards and in the field of interposer of semiconductor devices. Due to the employment of a copper-clad laminate having poor moisture resistance, delamination of multilayer printed wiring boards and poor pressure-cooker performance of packaged semiconductor devices has occurred.

Since a silane coupling agent layer is formed on an anti-corrosive layer comprising a zinc or zinc alloy layer formed on a copper foil and a chromate layer formed on the zinc or zinc alloy layer, there arise considerations such as combination of the silane coupling agent and the anti-corrosion layer, surface conditions of the anti-corrosion layer during adsorption of the silane coupling agent, and drying conditions. Thus, it is considered that no invention which brings out the maximum effect in the employed silane coupling agent has yet been accomplished.

BRIEF DESCRIPTION OF THE DRAWINGS

Each of FIGS. 1 and 3 is a schematic cross-sectional view of an apparatus for carrying out surface treatment. Each of FIGS. 2 and 4 is a schematic cross-sectional view of a surface-treated coper foil.

DESCRIPTION OF THE INVENTION

Figure 1:
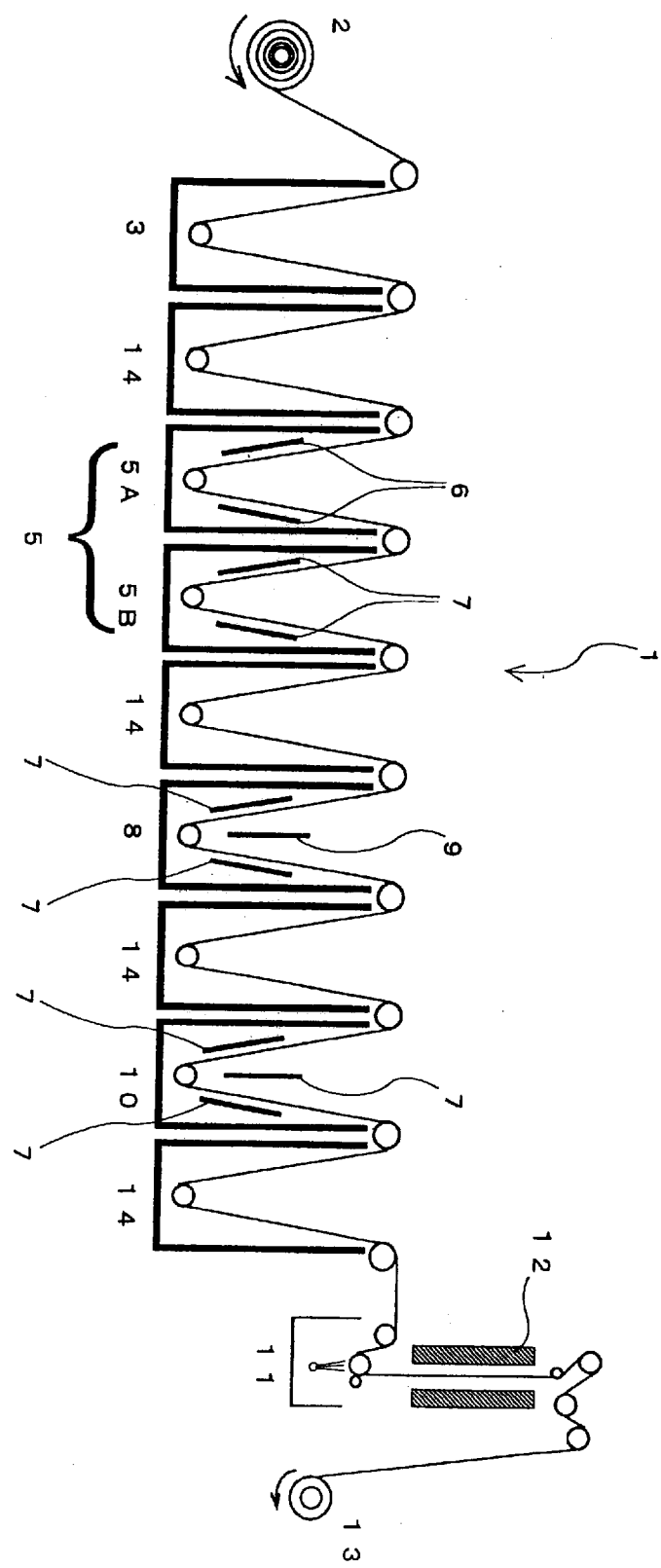

The present inventors have conducted extensive studies, and have found three important factors; i.e., conditions of the anti-corrosion layer before the copper foil is treated with a coupling agent, which is the most important factor; the timing of treatment with the silane coupling agent; and drying conditions after coupling treatment that must be addressed to bring out the maximum effect of the employed silane coupling agent. The present invention has been accomplished on the basis of these findings.

In one aspect of the present invention, there is provided a surface-treated copper foil for producing printed wiring boards which is obtained by subjecting to nodular treatment and anti-corrosion treatment a surface of a copper foil which has not been subjected to surface treatment, wherein the anti-corrosion treatment comprises forming a zinc or zinc alloy layer on a surface of the copper foil and forming an electrodeposited chromate layer on the zinc or zinc alloy layer; forming a silane coupling agent-adsorbed layer on the electrodeposited chromate layer without causing the electrodeposited chromate layer of the nodular-treated surface to attain dryness; and drying.

In another aspect of the present invention, there is provided a method for producing a surface-treated copper foil for producing printed wiring boards, which method comprises subjecting to nodular treatment at least one surface of a copper foil which has not been subjected to surface treatment; subjecting both surfaces of the nodular-treated copper foil to anti-corrosion treatment; and effecting adsorption of a silane coupling agent onto the nodular-treated surface, wherein the anti-corrosion treatment comprises forming a zinc or zinc alloy layer on a surface of the copper foil and forming an electrodeposited chromate layer on the zinc or zinc alloy layer; effecting adsorption of a silane coupling agent so as to form the silane-coupling-agent-adsorbed layer without causing the electrodeposited chromate layer to attain dryness; and subsequently drying.

In the present invention, an electrodeposited chromate layer is formed while an anti-corrosion layer is not caused to attain dryness before absorption of a silane coupling agent, and the silane coupling agent is adsorbed on the chromate layer which is kept wet after rinsing. The following three types of copper-clad laminates have been prepared, and characteristics thereof were compared. Prepared were copper-clad laminates employing a copper foil which had not been subjected to treatment with a silane coupling agent (samples (1)); copper-clad laminates employing a copper foil on which an electrodeposited chromate layer had been formed, and which had been dried and subjected to treatment with a silane coupling agent (samples (2)); and copper-clad laminates employing a copper foil on which an electrodeposited chromate layer had been formed, and which had not been dried and had been subjected to treatment with a silane coupling agent (samples (3)). The results are shown in Table 1. The employed copper foils have a thickness of 35 $\mu$m, and exhibit a peel strength of approximately 1.80 kg/cm under ambient conditions. Each of samples (1) to (3) comprised 7 lots.

TABLE 1

| | Results of peel test (0.8 mm-line-width circuit) | | | |
|---|---|---|---|---|
| | Initial peel strength kg/cm | Peel strength after solder float kg/cm | Resistance to HCl; Decrease in peel strength (%) | Moisture resistance; decrease in peel strength (%) |
| Samples (1) | | | | |
| 1 | 1.78 | 1.77 | 53.1 | 0.0 |
| 2 | 1.79 | 1.80 | 33.7 | 0.0 |
| 3 | 1.80 | 1.78 | 54.6 | 0.0 |
| 4 | 1.81 | 1.80 | 55.8 | 0.0 |
| 5 | 1.83 | 1.84 | 46.5 | 0.0 |
| 6 | 1.84 | 1.82 | 52.0 | 0.0 |
| 7 | 1.85 | 1.85 | 51.3 | 0.0 |
| Samples (2) | | | | |
| 1 | 1.79 | 1.80 | 1.0 | 0.0 |
| 2 | 1.80 | 1.82 | 2.0 | 0.0 |
| 3 | 1.80 | 1.79 | 10.6 | 0.0 |
| 4 | 1.81 | 1.81 | 1.5 | 0.0 |
| 5 | 1.82 | 1.81 | 8.9 | 0.0 |
| 6 | 1.83 | 1.81 | 17.6 | 0.0 |
| 7 | 1.85 | 1.86 | 9.8 | 0.0 |
| Samples (3) | | | | |
| 1 | 1.78 | 1.79 | 1.0 | 0.0 |
| 2 | 1.79 | 1.80 | 0.7 | 0.0 |
| 3 | 1.80 | 1.79 | 0.5 | 0.0 |
| 4 | 1.82 | 1.80 | 0.0 | 0.0 |
| 5 | 1.83 | 1.81 | 0.0 | 0.0 |
| 6 | 1.85 | 1.83 | 0.8 | 0.0 |
| 7 | 1.87 | 1.85 | 0.0 | 0.0 |

Initial peel strength: A copper-clad laminate was prepared with FR-4, and a copper pattern having a line width of 0.8 mm was formed on FR-4. The peel strength between the copper trace and the substrate was measured.
Peel strength after solder float: The copper-patterned board was floated on a solder bath (246° C.) for 20 seconds, and then cooled to room temperature. The peel strength was then measured.
Resistance to HCl (decrease in peel strength (%)): A copper-clad laminate was prepared with FR-4, and a copper trace having a line width of 0.8 mm was formed on FR-4. The thus-prepared board was immersed in a solution of hydrochloric acid and water (1:1) for one hour at room temperature, and then removed from the solution, rinsed, and dried. Immediately after the board was dried, the peel strength was measured. The percent decrease in peel strength with respect to the initial peel strength was calculated.
Moisture resistance (decrease in peel strength (%)): A copper-clad laminate was prepared with FR-4, and a cooper trace having a line width of 0.8 mm was formed on FR-4. The thus-prepared board was immersed in boiling ion-exchange water (pure water) for two hours, and then pulled from the water and dried. Immediately after the board was dried, the peel strength was measured. The percent decrease in peel strength with respect to the initial peel strength was calculated.

As is clear from Table 1, no remarkable difference is found among samples in terms of initial peel strength, peel strength after floating on solder bath, and moisture resistance. However, samples of group (1), which were not subjected to treatment with a silane coupling agent, exhibited the lowest resistance to hydrochloric acid (greatest decrease in peel strength) and may cause dropping of copper trace of a circuit, depending on circumstances for use. In contrast, samples of group (2), which employ copper foil that has been subjected to drying of the formed electrodeposited chromate layer and then treated with a silane coupling agent, exhibit considerably improved resistance to hydrochloric acid and a smaller decrease in peel strength, as compared with the samples of group (1). In the analysis, however, seven lots of samples belonging to samples of group (2) exhibit large deviation in decrease in peel strength among lots. Samples of group (3), which fall within the scope of the present invention, exhibit considerably consistent and small decrease in peel strength without interlot deviation, as compared with samples of group (2).

The resistance to hydrochloric acid is more clearly demonstrated in the results when the copper line width of the test samples becomes narrower. In this case, moisture resistance is also considerably affected. In the modes for carrying out the invention, decrease in peel strength was evaluated for 0.2-mm-width fine trace samples in addition to 0.8-mm-width circuit samples, and the results are shown to further demonstrate the excellent quality of the copper foil of the present invention.

The surface-treatment step includes nodular treatment and anti-corrosion treatment. Specifically, the surfaces of copper foil which has not been subjected to surface treatment; i.e., raw copper foil which is produced through a foil-making step, are treated. There are, for example, two methods for producing raw copper foils. One is continuous electrodeposition form a copper sulfate solution, and the other is stepwise rolling of a copper ingot. The term "copper foil which has not been subjected to surface treatment" herein refers to raw copper foil produced through any of the aforementioned methods (throughout the description, raw copper foil is referred to as simply copper foil).

The thus-produced untreated copper foil is subjected to nodular treatment, anti-corrosion treatment, and treatment with a silane coupling agent. Although the surface-treatment may be carried out in a sequential manner, in view of productivity there is preferably employed an apparatus in which a variety of baths are arranged in-line and serially as shown in FIG. 1, and a copper foil travels in a winding manner along the process line.

The initial form of the copper foil to be treated with such a surface-treating apparatus is roll, which is unwound and surface-treated in the apparatus. The unwound copper foil is transferred into a surface-treatment apparatus through an entrance. As shown in FIG. 1, rinsing baths are appropriately arranged in the surface-treatment apparatus. In the apparatus, the copper foil travels through a pickling bath, a nodular treatment bath (in which very fine copper particles are formed on the surface of copper foil to be bonded to the substrate), an anti-corrosion bath, a silane-coupling-treatment bath, and a drying section, which are arranged serially, thereby forming a surface-treated copper foil product.

Firstly, the copper foil is transferred into a pickling bath in which pickling is carried out in order to completely remove oily matter and surface oxide film from a copper foil, particularly a rolled copper foil. The copper foil is passed through the pickling bath so as to clean the surfaces and assure uniform electrodeposition carried out in a subsequent step. No particular limitation is imposed on the pickling solution, and a variety of solutions, such as hydrochloric acid solution, sulfuric acid solution, and sulfuric acid-hydrogen peroxide solution, can be employed. The concentration and temperature of the pickling solution may be determined in accordance with characteristics of the production line.

After pickling of the copper foil is completed, the copper foil is transferred into a nodular-treatment bath so as to form copper microparticles. More specifically, the treatment carried out in the nodular-treatment bath involves depositing copper microparticles on the side to be bonded to the substrate and seal-plating so as to prevent release of the copper microparticles. The latter seal-plating is not always required, and is carried out in accordance with the characteristics of the formed copper microparticles. For example, in most cases, very small copper microparticles which impart a brown to black appearance to the microparticle-deposited copper foil surface are not released from the surface, and therefore, do not need to seal-plating.

The concentration of the solution employed in the nodular-treatment bath for depositing copper microparticles is adjusted to be lower than that of the solution employed in level plating, so as to readily attain burnt deposition conditions. The burnt deposition conditions are not particularly limited, and are determined in consideration of characteristics of the production line. For example, when a copper sulfate solution is employed, the conditions are as follows: concentration of copper (5–20 g/l), concentration of sulfuric acid (50–200 g/l), solution temperature (15–40° C.), and current density (10–50 A/dm$^2$).

Subsequently, seal-plating is carried out in order to prevent release of the deposited copper microparticles. The seal-plating step involves the level deposition of copper such that the copper microparticles are covered with copper under level-plating conditions in order to prevent release of the deposited copper microparticles. The seal-plating conditions are not particularly limited, and are determined in consideration of characteristics of the production line. Any of a variety of solutions, such as copper sulfate solution and copper pyrosulfate solution, can be employed. For example, when a copper sulfate solution is employed, the conditions are as follows: concentration of copper (50–80 g/l), concentration of sulfuric acid (50–150 g/l), solution temperature (40–50° C.), and current density (10–50 A/dm$^2$).

After completion of the aforementioned seal-plating, copper ultra-microparticles of smaller particle size are further deposited on seal-plated copper microparticles in accordance with needs. Through deposition of copper ultra-microparticles, resistance to hydrochloric acid and moisture resistance of copper-clad laminates employing the thus-treated copper foil can be further enhanced. Thus, in another embodiment of the invention copper ultra-microparticles are further deposited on the seal-plated copper microparticles. There is provided a surface-treated copper foil for producing printed wiring boards which is obtained by subjecting to nodular treatment and anti-corrosion treatment a copper foil which has not been subjected to surface treatment, wherein the nodular treatment comprises depositing copper microparticles on a surface of the copper foil, seal-plating so as to prevent release of the copper microparticles, and further depositing copper ultra-microparticles; and the anti-corrosion treatment comprises forming a zinc or zinc alloy layer on a surface of the copper foil and forming an electrodeposited chromate layer on the zinc or zinc alloy layer, forming a silane coupling agent-adsorbed layer on the electrodeposited chromate layer without causing the electrodeposited chromate layer of the nodular-treated surface to attain dryness, and drying. The invention also provides a method for producing such a surface-treated copper foil.

In the present invention, arsenic is added to a solution in a copper ultra-microparticle-depositing bath. In this case, arsenic is added appropriately in an amount of 0.3–5.0 g/l. When the amount is less than 0.3 g/l, the size of the copper particles to be deposited cannot be uniformly reduced, whereas when the amount is in excess of 5.0 g/l, an improved size reduction effect of the deposited copper particles commensurate with addition cannot be attained. Thus, in order to form copper ultra-microparticles, arsenic is incorporated in an amount of 0.3–5.0 g/l under burnt deposition conditions. Other conditions, which are not particularly limited, are determined in consideration of characteristics of the production line. For example, when a copper sulfate solution is employed, the conditions are as follows: concentration of copper (5–20 g/l), concentration of sulfuric acid (50–200 g/l), solution temperature (15–40° C.), and current density (10–50 A/dm$^2$).

In the anti-corrosion bath, treatment to prevent oxidation and/or corrosion of a copper foil surface is carried out in accordance with purposes of use thereof such that, for example, the copper foil properties are not affected during production of copper-clad laminates and printed wiring boards. Any inorganic anti-corrosion treatment techniques, such as plating with zinc or zinc alloy and chromate treatment, may be employed. However, in order to attain an object of the present invention, a combination of zinc and electrodeposited chromate, or a combination of a zinc alloy such as zinc-nickel or zinc-cobalt and electrodeposited chromate is preferably employed, because these combinations exhibit excellent and consistent resistance to both hydrochloric acid and moisture when a silane coupling agent is simultaneously employed.

When nodular treatment is completed, both sides of the treated copper foil are subjected to anti-corrosion treatment with zinc. Examples of zinc plating baths include zinc pyrophosphate plating baths, zinc cyanide plating baths, and zinc sulfate plating baths. For example, when a zinc pyrophosphate bath is employed, plating conditions are as follows: zinc concentration of 5–30 g/l, potassium pyrophosphate concentration of 50–500 g/l, solution temperature of 20–50° C., pH of 9–12, and current density of 0.3–10 A/dm$^2$.

When zinc-nickel anti-corrosion treatment is performed, typical plating conditions are as follows: zinc concentration of 5.0–30.0 g/l, nickel concentration of 0.5–20 g/l, potassium pyrophosphate concentration of 50–500 g/l, solution temperature of 20–50° C., pH of 9–12, and current density of 0.3–10 A/dm$^2$.

When zinc-cobalt anti-corrosion treatment is performed, typical plating conditions are as follows: zinc concentration of 5.0–30.0 g/l, cobalt concentration of 0.5–20 g/l, potassium pyrophosphate concentration of 50–500 g/l, solution temperature of 20–50° C., pH of 9–12, and current density of 0.3–10 A/dm$^2$.

Typical conditions of formation of an electrodeposited chromate layer on the zinc or zinc alloy layer are as follows: chromic acid concentration of 0.3–10 g/l, pH of 10–12.5, solution temperature of 25–40° C., and current density of 0.3–10 A/dm$^2$.

Immediately after completion of formation of the electrodeposited chromate layer; i.e., before the copper foil becomes dry, adsorption of a silane coupling agent is performed, to thereby form a silane coupling agent layer. No particular limitation is imposed on the method for forming the silane coupling agent layer, and methods such as immersion, showering, and spraying may be adopted. Any method may be employed in accordance with production steps, so long as the method can bring the copper foil into contact with a solution containing the silane coupling agent in the most uniform state.

Any silane coupling agent selected from among olefin-group-substituted silanes, epoxy-group-substituted silanes, acrylic-group-substituted silanes, amino-group-substituted silanes, and mercapto-group-substituted silanes can be employed. These silane coupling agents have been already confirmed to exhibit no effect on an etching step and the performance of produced printed wiring boards.

More specifically, coupling agents employed for glass cloth treatment contained in a prepreg for producing printed wiring boards can also be used. Examples of such coupling agents include vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, γ-aminopropyltriethoxysilane, N-β-(aminoethyl)-γ-aminopropyltrimethoxysilane, N-3-(4-(3-aminopropoxy) butoxy)propyl-3-aminopropyltrimethoxysilane, imidazolylsilane, triazinylsilane, and γ-mercaptopropyltrimethoxysilane.

These silane coupling agents are dissolved in water in a concentration of 0.3–15 g/l, and treatment is carried out at room temperature. The silane coupling agent is coupled through condensation with OH groups contained in the anti-corrosion layer of the copper foil, to thereby form a coating layer. Thus, a coupling agent solution of excessively higher concentration cannot enhance performance commensurate with an increase in concentration, so the concentration should be determined in accordance with treatment conditions such as treatment speed. However, when the concentration is less than 0.3 g/l, adsorption of the silane coupling agent is slow, thereby failing to attain a typical commercial profit and failing to attain uniform adsorption. In contrast, even when the concentration is in excess of 15 g/l, adsorption rate does not particularly increase and such an adsorption rate is economically disadvantageous.

The drying step is carried out finally so as to remove water. In addition, the step must be carried out so as to accelerate condensation reaction between the adsorbed coupling agent and OH groups contained in the surface of the anti-corrosion layer and to completely evaporate water generated during condensation reaction. The drying step cannot be carried out at a temperature that causes breakage or decomposition of a functional group of the silane coupling agent that forms a bond with a resin constituting a substrate during bonding with the substrate. The reason for selection of the drying temperature is that adhesion between a copper foil and the substrate becomes poor when there occurs breakage or decomposition of the functional group of the silane coupling agent that forms a bond with a resin constituting a substrate, to thereby fail to attain a maximum effect of the adsorbed silane coupling agent.

Particularly, a copper foil; i.e., metallic material, exhibits rapid thermal conduction as compared with glass and organic material such as plastics to which a silane coupling agent is typically applied. Thus, the silane coupling agent adsorbed on the copper foil is subjected to considerable heat; i.e., high temperature during drying and heat radiated from a heat source. Accordingly, the foil is preferably dried by means of being passed through a heating furnace for 3–6 seconds such that the foil temperature reaches 105° C. to 170° C. Under such drying conditions, functional groups which are contained in the silane coupling agent layer formed on the nodular-treated side of the substrate and which are bonded to the substrate remain intact, thereby attaining sufficient deposition of the coupling agent to the copper foil surface. Thus, copper-clad laminates produced from the surface-treated copper foil of the present invention exhibit resistance to hydrochloric acid and moisture resistance without deviation between lots.

The copper foil of the present invention is produced by sequentially forming an electrodeposited chromate layer, rinsing, and forming a silane coupling layer without drying the surface to which the coupling agent is applied. Thus, a greater amount of water remains in the copper foil during drying as compared with the case of a surface-treated copper foil produced by sequentially forming an electrodeposited chromate layer, drying, and forming a silane coupling layer. During heating to dry, a considerable amount of heat is consumed for evaporating water. Thus, it is assumed that even though the drying atmosphere temperature is elevated, heat for breaking or decomposing functional groups of the silane coupling agent is difficult to generate. In order to confirm the assumption, copper foils according to the present invention having a thickness of 35 μm were produced by drying at varied temperatures for four seconds, and each of the produced copper foils was laminated with FR-4 to produce a copper-clad laminate. An electric circuit having a line width of 0.8 mm was formed from the copper-clad laminate, and the results of evaluation are shown in Table 2.

TABLE 2

| | Peel test results (0.8 mm-line-width circuit) | | | |
|---|---|---|---|---|
| Foil temperature at drying | Initial peel strength kg/cm | Peel strength after floating on solder bath kg/cm | Resistance to HCl; decrease in peel strength (%) | Moisture resistance; decrease in peel strength (%) |
| 100° C. | 1.81 | 1.80 | 10.5 | 0.0 |
| 105° C. | 1.80 | 1.82 | 2.0 | 0.0 |
| 150° C. | 1.82 | 1.81 | 1.5 | 0.0 |
| 170° C. | 1.81 | 1.80 | 0.9 | 0.0 |
| 180° C. | 1.82 | 1.81 | 14.8 | 0.0 |

Initial peel strength: A copper-clad laminate was prepared from FR-4, and a copper pattern having a line width of 0.8 mm was formed on FR-4. The peel strength between the copper line and the substrate was measured.
Peel strength after floating on solder bath: The copper-patterned board was floated on a solder bath (246° C.) for 20 seconds, and then cooled to room temperature. The peel strength was then measured.
Resistance to HCl (decrease in peel strength (%)): A copper-clad laminate was prepared from FR-4, and a copper pattern having a line width of 0.8 mm was formed on FR-4. The thus-prepared board was immersed in a mixture of hydrochloric acid and water (1:1) for one hour at room temperature, and then removed from the mixture, rinsed, and dried. Immediately after the board was dried, the peel strength was measured. The percent decrease in peel strength with respect to the initial peel strength was calculated.
Moisture resistance (decrease in peel strength (%)): A copper-clad laminate was prepared from FR-4, and a copper pattern having a line width of 0.8 mm was formed on FR-4. The thus-prepared board was immersed in boiling ion-exchange water (pure water) for two hours, and then pulled from the water and dried. Immediately after the board was dried, the peel strength was measured. The percent decrease in peel strength with respect to the initial peel strength was calculated.

As is clear from Table 2, when the temperature of copper foils per se at drying (foil temperature) falls outside the range of 105° C. to 170° C., resistance to hydrochloric acid is poor. In contrast, when the temperature falls within the range of 105° C. to 170° C., resistance to hydrochloric acid is constant and satisfactory. Thus, it is considered that when the foil temperature is lower than 105° C. a silane coupling agent is insufficiently fixed onto the copper foil to attain poor adhesion to a substrate. It is also considered that the functional groups of the silane coupling agent that are to be bonded with the substrate are broken or decomposed to thereby lower resistance to hydrochloric acid (to elevate decrease ratio in peel strength) when the foil temperature is in excess of 170° C.

As described hereinabove, surface-treated copper foils according to the present invention were produced. Copper-clad laminates fabricated from the copper foils produced in the aforementioned manner exhibit excellent resistance to hydrochloric acid and moisture resistance. Thus, a copper-clad laminate employing a surface-treated copper foil has considerably improved quality.

In the present specification, the term "copper-clad laminate" encompasses a single-sided-substrate, a double-sided substrate, and a multilayer substrate. Such substrates may be fabricated from a rigid substrate, a hybrid substrate, or a flexible substrate, including a specially designed substrate such as TAB or COB.

MODES FOR CARRYING OUT THE INVENTION

Embodiments of the present invention will next be described. In the following embodiments, methods for surface-treating of the present invention and copper-clad laminates produced from the thus-surface-treated copper foils are described, along with results of evaluation. The raw copper foils employed in the following embodiments were electrodeposited copper foils.

First Embodiment

Figure 2:
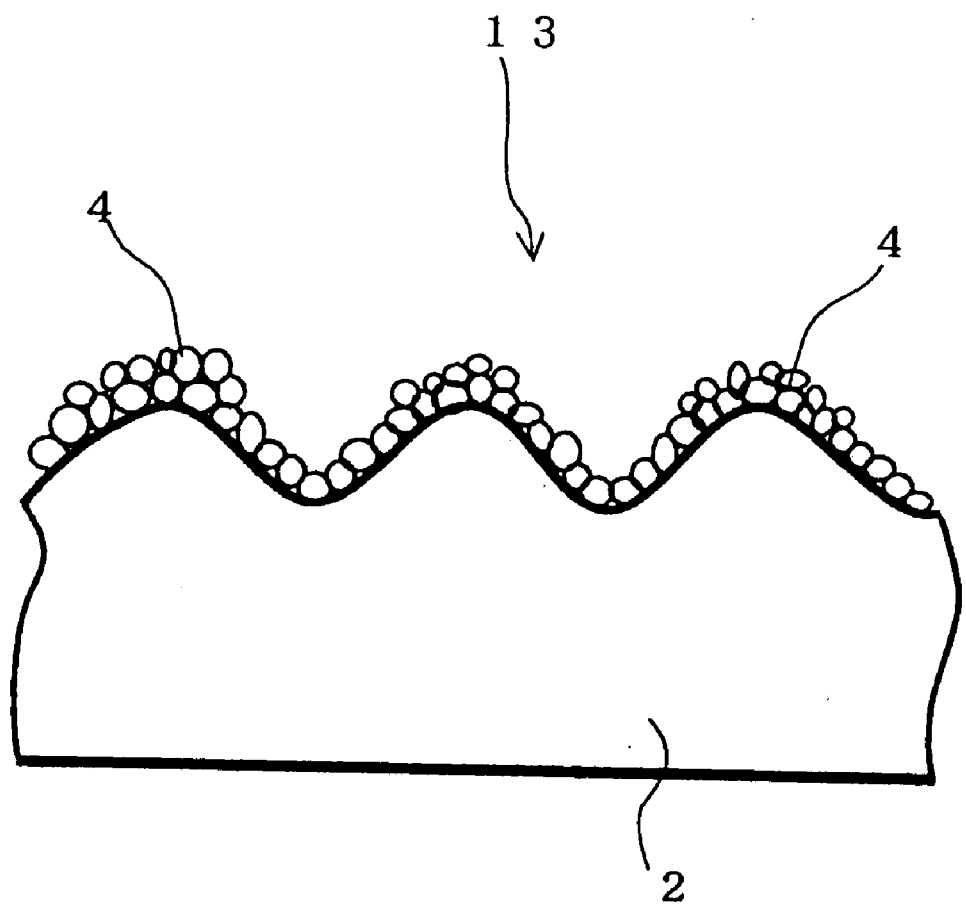

In a First Embodiment, an electrodeposited copper foil 2 was surface-treated with a surface-treatment apparatus 1. The employed electrodeposited copper foil 2 was in roll before surface treatment. In the apparatus 1 shown in FIG. 1, an electrodeposited copper foil 2 is unwound from a foil roll and travels, in a winding manner, through the surface-treatment apparatus 1. A copper foil having a nominal thickness of 35 μm and classified as Grade 3 was employed as the electrodeposited copper foil 2, to thereby produce an electrodeposited copper foil employed in printed wiring boards. Hereinafter, production conditions will be described with reference to an apparatus wherein a variety of baths are continuously arranged in-line. The embodiment will be described with reference to FIG. 2 showing a cross-sectional view of the surface-treated copper foil.

The electrodeposited copper foil 2 taken from the foil roll was transferred firstly into a pickling bath 3 filled with a diluted sulfuric acid solution having a concentration of 150 g/l at 30° C. The foil was immersed for 30 seconds, to remove oily matter and surface oxide film from the surface of the electrodeposited copper foil 2.

After the electrodeposited copper foil 2 had been treated in the pickling bath 3, the foil was transferred into nodular-treatment baths 5 in order to form copper microparticles 4 on the surface of the electrodeposited copper foil 2. The treatment carried out in the nodular-treatment baths 5 involved depositing copper microparticles 4 on one surface of the electrodeposited copper foil 2 (step 5A) and seal-plating so as to prevent release of the copper microparticles 4 (step 5B). In this case, the electrodeposited copper foil 2 itself was cathodically polarized, and appropriate anodes were disposed for carrying out electrolysis.

Step 5A, depositing copper microparticles 4 on the electrodeposited copper foil 2, employed a copper sulfate solution (sulfuric acid concentration of 100 g/l, copper concentration of 18 g/l, temperature 25° C.), and electrolysis was carried out for 10 seconds under conditions for forming burnt deposit at a current density of 10 A/dm$^2$. In this case, as shown in FIG. 1, anode plates 6 were placed to face in parallel with the surface of the electrodeposited copper foil 2, onto which copper microparticles 4 are formed.

Step 5B, seal-plating so as to prevent release of the copper microparticles 4, employed a copper sulfate solution (sulfuric acid concentration of 150 g/l, copper concentration of 65 g/l, temperature 45° C.), and electrolysis was carried out for 20 seconds under uniform plating conditions and at a current density of 15 A/dm$^2$. In this case, as shown in FIG. 1, anode plates 7 were placed to face in parallel with the copper-microparticles (4)-deposited surface of the electrodeposited copper foil 2. The anodes 6 and 7 were formed of the identical stainless steel plates, and these anodes are hereinafter referred to as anodes 7.

First anti-corrosion treatment was carried out in a first anti-corrosion-treatment bath 8, by use of zinc as a corrosion-inhibiting element. The zinc concentration in the anti-corrosion-treatment bath 8 was maintained by employing a soluble anode 9 formed of a zinc plate as shown in FIG. 1. The electrolysis was carried out in a concentration-controlled zinc sulfate solution comprising sulfuric acid (70 g/l) and zinc (20 g/l), at a temperature of 40° C. for five seconds and a current density of 15 A/dm$^2$.

Second anti-corrosion treatment was carried out in a second anti-corrosion-treatment bath 10, to thereby electrolytically form a chromate layer on the zinc anti-corrosion layer formed in the first anti-corrosion treatment bath 8. The electrolysis was carried out in a solution comprising chromic acid (5.0 g/l), at a temperature of 35° C. and a pH of 11.5 for five seconds and a current density of 8 A/dm$^2$. In this case, as shown in FIG. 1, anode plates 7 were placed such that the anode plates faced, in parallel, the surface of the copper foil.

After completion of the anti-corrosion treatment, the copper foil was rinsed with water, and immediately and without drying the surface of the copper foil, adsorption of a silane coupling agent on the anti-corrosion layer of the nodular-treated side was carried out in a silane-coupling-agent-treatment bath 11. The employed solution was formed of γ-glycidoxypropyltrimethoxysilane (5 g/l) dissolved in ion-exchange water. The solution was sprayed onto the copper foil surface through showering.

After completion of the silane-coupling-agent treatment, the electrodeposited copper foil 2 was passed through, over 4 seconds, a heated furnace including a drying section 12 where the atmosphere had been adjusted by means of an electric heater so as to attain a foil temperature of 140° C. The thus-dehydrated surface-treated copper foil 13 was then wound into a roll. During the aforementioned steps, the electrodeposited copper foil ran at 2.0 m/minute. A rinsing bath 14 capable of performing about 15 sec. water-rinsing was arranged between successive operation baths, thereby preventing the solution from being carried over from the previous bath.

The thus-formed surface-treated copper foil 13 and two sheets of FR-4 prepreg having a thickness of 150 μm were laminated to prepare a double-sided copper-clad laminate. The peel strength at the adhesive interface between the surface-treated copper foil 13 and the FR-4 substrate was measured. The measurement was carried out at three points per sample, and the results are shown in Table 3. Test results of samples (1) and samples (2) that are shown in Table 1 are also shown as data for comparison in Table 3.

Second Embodiment

Figure 3:
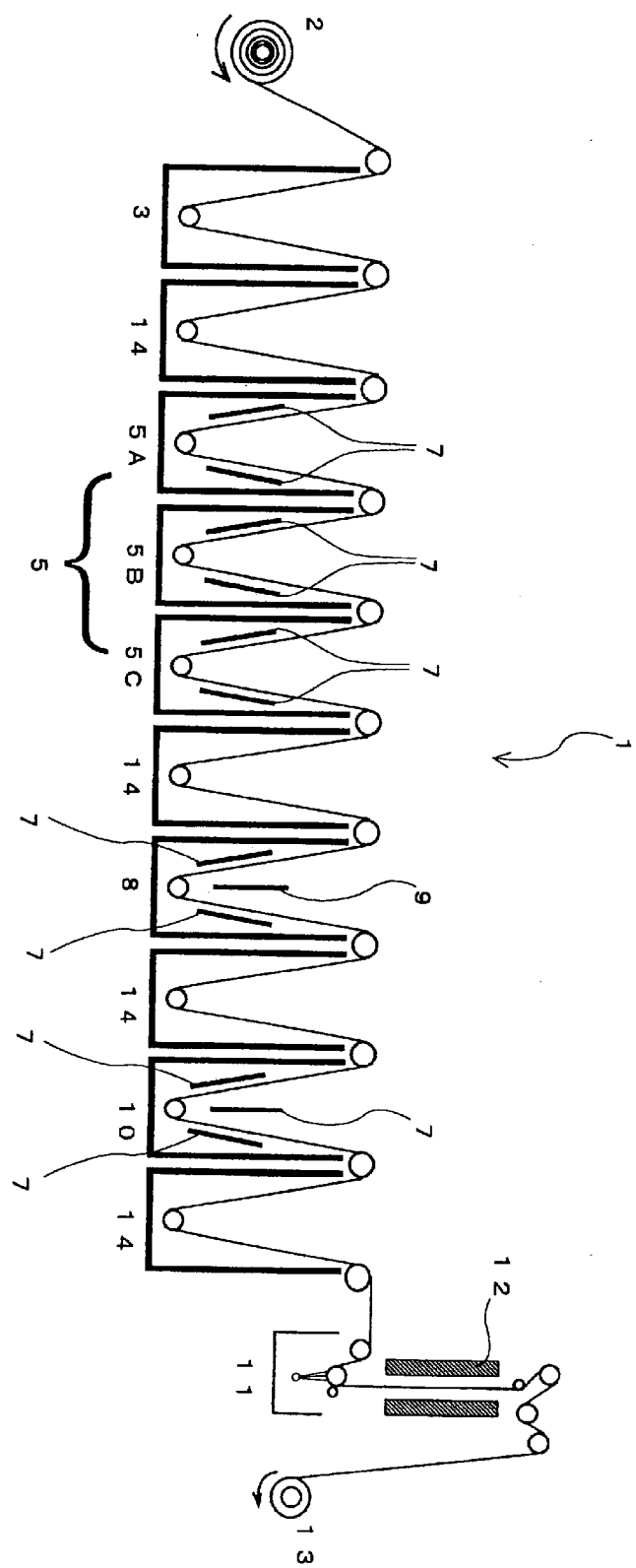
Figure 4:
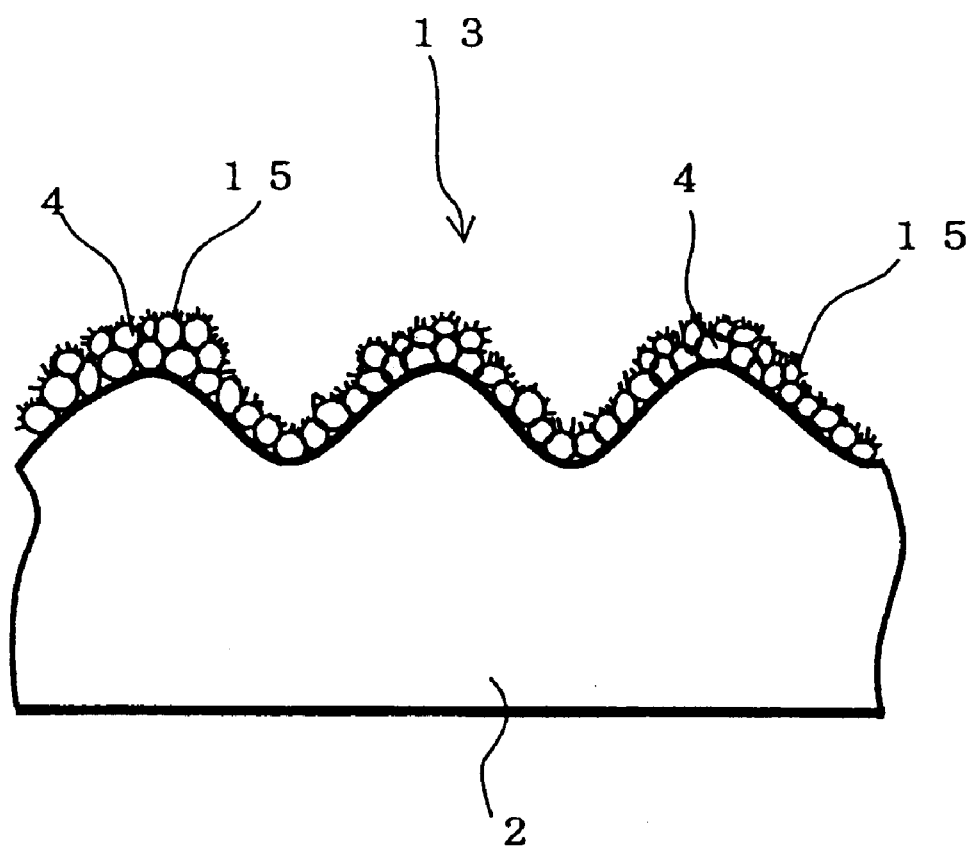

In Second Embodiment, an electrodeposited copper foil 2 was surface-treated with a surface-treatment apparatus 1. The employed electrodeposited copper foil 2 was in roll before surface treatment. In the apparatus 1 shown in FIG. 3, an electrodeposited copper foil 2 is unwound from a foil roll and travels, in a winding manner, in the surface-treatment apparatus 1. A copper foil having a nominal thickness of 35 μm and classified as Grade 3 was employed as the electrodeposited copper foil 2, to thereby produce an electrodeposited copper foil employed in printed wiring boards. Hereinafter, production conditions will be described with reference to an apparatus wherein a variety of baths are continuously arranged in-line. In order to avoid redundant description, only portions that differ from corresponding portions described in relation to the First Embodiment will be described. Portions identical with those of the First Embodiment are denoted by the same reference numerals in FIG. 3, so far as such is possible. The embodiment will be described with reference to FIG. 4 showing a cross-sectional view of the surface-treated copper foil.

The flow of surface treatment carried out in the Second Embodiment is identical with that of First Embodiment, except that the nodular treatment carried out in baths 5 comprises three steps; i.e., step 5A for depositing copper microparticles 4; seal-plating step 5B; and step 5C for depositing copper ultra-microparticles 15. Briefly, the step 5C for depositing copper ultra-microparticles is arranged between the seal-plating step 5B, as carried out in First Embodiment, and the first anti-corrosion step carried out in the bath 8.

Step 5C, depositing copper ultra-microparticles 15, employs a copper sulfate solution (copper concentration of 10 g/l, sulfuric acid concentration of 100 g/l, arsenic concentration of 1.5 g/l, temperature 38° C.), and electrolysis was carried out at a current density of 30 A/dm$^2$. Other conditions of treatment steps carried out in the baths are identical with those employed in the First Embodiment.

The thus-formed surface-treated copper foil 13 and two sheets of FR-4 prepreg having a thickness of 150 μm and serving as substrates were laminated to prepare a double-sided copper-clad laminate. The peel strength at the adhesive interface between the surface-treated copper foil 13 and the FR-4 substrate was measured. The measurement was carried out at three points per sample, and the results are shown in Table 3. Test results of samples (1) and samples (2) that are shown in Table 1 are also shown as data for comparison in Table 3.

TABLE 3

Peel test results (0.2 mm-line-width circuit)

| | Initial peel strength kg/cm | Peel strength after floating on solder bath kg/cm | Resistance to HCl; Decrease in peel strength (%) | Moisture resistance; decrease in peel strength (%) |
|---|---|---|---|---|
| Samples (1) | | | | |
| 1 | 1.80 | 1.79 | 84.5 | 23.5 |
| 2 | 1.81 | 1.81 | 84.4 | 32.7 |
| 3 | 1.83 | 1.81 | 82.1 | 31.8 |
| 4 | 1.84 | 1.85 | 80.2 | 25.1 |
| 5 | 1.85 | 1.84 | 83.7 | 28.9 |
| 6 | 1.85 | 1.83 | 80.6 | 31.9 |
| 7 | 1.87 | 1.85 | 81.7 | 32.4 |
| Samples (2) | | | | |
| 1 | 1.80 | 1.81 | 60.8 | 21.8 |
| 2 | 1.81 | 1.80 | 48.7 | 21.4 |
| 3 | 1.81 | 1.79 | 80.5 | 8.1 |
| 4 | 1.82 | 1.81 | 46.3 | 18.7 |
| 5 | 1.83 | 1.81 | 52.6 | 24.8 |
| 6 | 1.85 | 1.84 | 54.3 | 26.5 |
| 7 | 1.86 | 1.85 | 58.8 | 16.8 |
| First Embodiment | | | | |
| 1 | 1.81 | 1.80 | 1.8 | 6.9 |
| 2 | 1.83 | 1.82 | 2.6 | 8.3 |
| 3 | 1.82 | 1.80 | 1.0 | 6.5 |
| Second Embodiment | | | | |
| 1 | 1.85 | 1.83 | 0.0 | 0.0 |
| 2 | 1.87 | 1.86 | 0.0 | 0.2 |
| 3 | 1.90 | 1.87 | 0.3 | 2.6 |

Initial peel strength: A copper-clad laminate was prepared from FR-4, and a copper pattern having a line width of 0.2 mm was formed on FR-4. The peel strength between the copper line and the substrate was measured.
Peel strength after floating on solder bath: The copper patterned board was floated on a solder bath (246° C.) for 20 seconds, and then cooled to room temperature. The peel strength was then measured.
Resistance to HCl (decrease in peel strength (%)): A copper-clad laminate was prepared from FR-4, and a copper pattern having a line width of 0.2 mm was formed on FR-4. The thus-prepared board was immersed in a mixture of hydrochloric acid and water (1:1) for one hour at room temperature, and then removed from the mixture, rinsed, and dried. Immediately after the board was dried, the peel strength was measured. The percent decrease in peel strength with respect to the initial peel strength was calculated.
Moisture resistance (decrease in peel strength (%)): A copper-clad laminate was prepared from FR-4, and a copper pattern having a line width of 0.2 mm was formed on FR-4. The thus-prepared board was immersed in boiling ion-exchange water (pure water) for two hours, and then pulled from the water and dried. Immediately after the board was dried, the peel strength was measured. The percent decrease in peel strength with respect to the initial peel strength was calculated.

In connection with the results shown Table 3, a peel test was carried out for a trace having a line width of 0.2 mm, which is narrower than the line width of the traces employed in connection with Tables 1 and 2. Thus, the test is more severe than a similar test employing samples having a line width of 0.8 mm (Tables 1 and 2), and moisture resistance has clearly changed. As is clear from Table 3, resistance to hydrochloric acid of samples (1) and (2) is definitely lower than resistance to hydrochloric acid of samples having a line width of 0.8 mm, and moisture resistance is drastically lower. In contrast, copper-clad laminates employing the surface-treated copper foil 13 of the present invention exhibit no substantial difference between the 0.2-mm-line-width test and the 0.8-mm-line-width test. Thus, resistance to hydrochloric acid and moisture resistance of samples according to the present invention are remarkably excellent without interlot variation, and the copper foil of the present invention exhibits excellent performance as compared with conventional copper foils.

Effects of the Invention

By employing the surface-treated copper foil of the present invention, drastically improved reliability in adhesion of a copper-foil-derived circuit in printed wiring boards is obtained; various methods for processing printed wiring boards can be applied; and control of production steps becomes easier. In addition, the method of the present invention for producing the surface-treated copper foil can provide a surface-treated copper foil exhibiting a maximum effect of the silane coupling agent adsorbed onto the copper foil.

What is claimed is:

1. A surface-treated copper foil for producing printed wiring boards which is obtained by subjecting to nodular treatment and anti-corrosion treatment a surface of a copper foil which has not been surface-treated, wherein the anti-corrosion treatment comprises forming a zinc or zinc alloy layer on a surface of a copper foil and forming an electrodeposited chromate layer on the zinc or zinc alloy layer; forming a silane coupling agent-adsorbed layer on the electrodeposited chromate layer without causing the electrodeposited chromate layer to attain dryness; and drying.

2. A surface-treated copper foil according to claim 1, wherein the silane coupling agent is any member selected from among olefin-group-substituted silanes, epoxy-group-substituted silanes, acrylic-group-substituted silanes, amino-group-substituted silanes, and mercapto-group-substituted silanes.

3. A copper-clad laminate prepared through employing a surface-treated copper foil recited in claim 1.

4. A surface-treated copper foil according to claim 1, wherein said zinc alloy is a zinc-nickel alloy or a zinc-cobalt alloy.

5. A surface-treated copper foil for producing printed wiring boards which is obtained by subjecting to nodular treatment and anti-corrosion treatment a copper foil which has not been surface-treated, wherein the nodular treatment comprises depositing copper microparticles on a surface of a copper foil, seal-plating so as to prevent release of the copper microparticles, and further depositing copper ultra-microparticles; and the anti-corrosion treatment comprises forming a zinc or zinc alloy layer on a surface of a copper foil and forming an electrodeposited chromate layer on the zinc or zinc alloy layer, forming a silane coupling agent-adsorbed layer on the electrodeposited chromate layer without causing the electrodeposited chromate layer to attain dryness, and drying.

6. A copper-clad laminate prepared through employing a surface-treated copper foil recited in claim 5.

7. A surface-treated copper foil according to claim 5, wherein the silane coupling agent is any member selected from among olefin-group-substituted silanes, epoxy-group-substituted silanes, acrylic-group-substituted silanes, amino-group-substituted silanes, and mercapto-group-substituted silanes.

8. A surface-treated copper foil according to claim 5, wherein said zinc alloy is a zinc-nickel alloy or a zinc-cobalt alloy.

9. A method for producing a surface-treated copper foil as recited in claim 1, which method comprises subjecting to nodular treatment at least one surface of a copper foil which has not been surface-treated; subjecting both surfaces of the nodular-treated copper foil to anti-corrosion treatment; and effecting adsorption of a silane coupling agent onto the nodular-treated surface, wherein the anti-corrosion treatment comprises forming a zinc layer or a zinc alloy layer on a surface of the copper foil and forming an electrodeposited chromate layer on the zinc or zinc alloy layer; effecting adsorption of a silane coupling agent so as to form the silane-coupling-agent-adsorbed layer without causing the electrodeposited chromate layer to attain dryness; and subsequently drying.

10. A method for producing a surface-treated copper foil as recited in claim 9, wherein the foil is dried at a temperature such that the foil temperature is 105° C. to 170° C.

11. A method for producing a surface-treated copper foil as recited in claim 5, which method comprises subjecting to nodular treatment at least one surface of a copper foil which has not been surface-treated; subjecting two surfaces of the nodular-treated copper foil to anti-corrosion treatment; and effecting adsorption of a silane coupling agent onto the nodular-treated surface, wherein the nodular treatment comprises depositing copper microparticles on at least one surface of a copper foil, effecting seal-plating, and then depositing copper ultra-microparticles thereon; and the anti-corrosion treatment following the nodular treatment comprises forming a zinc or zinc alloy layer, forming an electrodeposited chromate layer, forming a silane coupling agent-adsorbed layer without causing the electrodeposited chromate layer of the nodular-treated surface to attain dryness, and drying.

12. A method for producing a surface-treated copper foil as recited in claim 11, wherein the foil is dried at a temperature such that the foil temperature is 105° C. to 170° C.

13. A method for producing a surface-treated copper foil of claim 11, wherein said copper ultra-mircoparticles are deposited from a copper bath containing about 0.3 to 5.0 g/l of arsenic.

* * * * *